US009184640B2

(12) United States Patent
Morimoto et al.

(10) Patent No.: US 9,184,640 B2
(45) Date of Patent: Nov. 10, 2015

(54) MOTOR CONTROLLER AND PRODUCTION METHOD OF THE SAME

(71) Applicant: NSK LTD., Shinagawa-ku, Tokyo (JP)

(72) Inventors: Masakazu Morimoto, Tokyo (JP); Tadayoshi Osakabe, Tokyo (JP); Osamu Miyoshi, Tokyo (JP)

(73) Assignee: NSK Ltd., Tokyo (JP)

(*) Notice: Subject to any disclaimer, the term of this patent is extended or adjusted under 35 U.S.C. 154(b) by 0 days.

(21) Appl. No.: 14/408,334

(22) PCT Filed: Apr. 2, 2014

(86) PCT No.: PCT/JP2014/001922
§ 371 (c)(1),
(2) Date: Dec. 16, 2014

(87) PCT Pub. No.: WO2014/162738
PCT Pub. Date: Apr. 2, 2014

(65) Prior Publication Data
US 2015/0137636 A1 May 21, 2015

(30) Foreign Application Priority Data
Apr. 5, 2013 (JP) ................. 2013-079669

(51) Int. Cl.
H02K 5/22 (2006.01)
B62D 5/04 (2006.01)
(Continued)

(52) U.S. Cl.
CPC .............. H02K 5/225 (2013.01); B62D 5/0406 (2013.01); H02K 9/22 (2013.01); H02K 11/0073 (2013.01); H05K 13/0023 (2013.01)

(58) Field of Classification Search
CPC ...... H01R 12/523; H01R 12/57; H01R 12/58; H01R 12/721
See application file for complete search history.

(56) References Cited

U.S. PATENT DOCUMENTS 4,761,144 A * 8/1988 Hunt et al. .................... 439/545
6,383,031 B1 * 5/2002 Law et al. ..................... 439/680
(Continued)

FOREIGN PATENT DOCUMENTS

JP 2002-231375 A 8/2002
JP 2008-4364 A 1/2008
(Continued)

OTHER PUBLICATIONS

International Search Report (PCT/ISA/210) dated Jul. 1, 2014, with English translation (two (2) pages).
(Continued)

Primary Examiner — Truc Nguyen
(74) Attorney, Agent, or Firm — Crowell & Moring LLP

(57) ABSTRACT

A motor controller and a production method thereof are provided to be capable of lowering the stress applied to joint parts of terminals and a board as much as possible, even if a thermal load or external force is applied to the connector, and in addition, capable of achieving a sufficient coupling strength when arranged in proximity to the electric motor. In the motor controller, there are provided: a first securing section (56a) and a second securing section (56b) configured to secure a connector (50) to the case (20) at an outer circumference of a connector housing (53) of the connector (50); and a positioning section (58) configured to position the connector (50) to the case (20), when the connector (50) is inserted into the connector receiving depression section (22a).

9 Claims, 12 Drawing Sheets

(51) Int. Cl.
*H02K 11/00* (2006.01)
*H02K 9/22* (2006.01)
*H05K 13/00* (2006.01)

(56) References Cited

U.S. PATENT DOCUMENTS

| | | | |
|---|---|---|---|
| 6,800,807 B2* | 10/2004 | Ishiguro et al. | 174/50 |
| 7,201,586 B2* | 4/2007 | Kohlenberg et al. | 439/76.2 |
| 7,597,560 B2* | 10/2009 | Korich et al. | 439/34 |
| 7,614,886 B2* | 11/2009 | Choi | 439/76.2 |
| 2002/0101041 A1 | 8/2002 | Kameyama | |
| 2002/0168882 A1* | 11/2002 | Chiriku et al. | 439/76.2 |
| 2004/0021547 A1* | 2/2004 | Vicenza et al. | 337/186 |
| 2004/0219806 A1* | 11/2004 | Kobayashi | 439/76.2 |
| 2006/0141820 A1* | 6/2006 | Naito et al. | 439/76.1 |
| 2008/0124970 A1 | 5/2008 | Yasuda et al. | |
| 2013/0109203 A1 | 5/2013 | Nakanishi | |
| 2014/0051270 A1* | 2/2014 | Miyazaki et al. | 439/76.2 |

FOREIGN PATENT DOCUMENTS

| | | |
|---|---|---|
| JP | 2012-153243 A | 8/2012 |
| JP | 2012-174503 A | 9/2012 |
| WO | WO 2008/146664 A1 | 12/2008 |
| WO | WO 2012/011395 A1 | 1/2012 |

OTHER PUBLICATIONS

Written Opinion (PCT/ISA/237) dated Jul. 1, 2014 (three (3) pages).

* cited by examiner

MOTOR CONTROLLER AND PRODUCTION METHOD OF THE SAME

TECHNICAL FIELD

The present disclosure relates to a motor controller such as an electronic control unit (ECU: Electronic Control Unit) in an electric power steering apparatus and a production method of the same.

BACKGROUND ART

The electronic control unit in the electric power steering apparatus controls driving of the electric motor, and includes a power module board on which power devices are mounted and a control board. The power module board is electrically connected to the electric motor through an output connector, and the control board is electrically connected to an automobile battery or a torque sensor through a power supply and signal connector.

As the electronic control unit in one technology of the electric power steering apparatus of this type, for example, the electronic control unit (see PLT 1) illustrated in FIG. 11 is known. FIG. 11 is an exploded perspective view of an example of the electronic control unit in the electric power steering apparatus, in one technology.

An electronic control unit 200 illustrated in FIG. 11 includes a case 210 made by aluminum die-casting and having a substantially rectangular parallelepiped shape, a power module board 220, a base 230, a control board 240, and a cover 250 made of a metal plate.

On the mounting surface of the power module board 220, electronic parts including a power device for making a driving current flow to the electric motor (not illustrated) is mounted and an electric circuit is formed.

In addition, the base 230 overlaps with the power module board 220 and the control board 240 to support the power module board 220 and the control board 240, and an output connector 231 is integrally formed by insert molding.

Further, on the mounting surface of the control board 240, an electronic part (not illustrated) to control the driving of the electric motor is mounted and an electric circuit is formed. Furthermore, a power supply and signal connector 241 is mounted on an end edge part of the mounting surface of the control board 240. The power supply and signal connector 241 includes a housing 242, and plural electrical power terminals and plural signal terminals (not illustrated) attached to the housing 242. A connector coupled with a cable electrically connected to the automobile battery and the torque sensor, or another control device which are not illustrated is engaged with the power supply and signal connector 241.

In the assembly operation of the electronic control unit 200, firstly, the power module board 220 is set up on the inside of the case 210. Then, the power module board 240 is secured to the case 210 with plural screws 201.

Next, the base 230 is placed on the case 210, and in addition, the output connector 231 is placed in an aperture 210a of the case 210. Then, the base 230 is secured to the case 210 with plural screws 203, and the output connector 231 is secured to the case 210 with plural screws 202.

Subsequently, upper ends of terminals 221, protruding from an opening of the output connector 231, on the power module board 220 and the upper ends of terminals 232 of the output connector 231 are connected by spot welding, respectively, and upper ends of terminals 222, protruding from an opening of the base 230, on the power module board 240 and upper ends of terminals 233 of the base 230 are connected by spot welding, respectively. Hence, the power module board 220 is supported by the base 230, and in addition, the power module board 220 and the output connector 231 are electrically connected.

Then, the control board 240 is placed on tubes 234 of the base 230. The control board 240 is secured onto the base 230 and the case 210 with plural screws 204. Thus, the control board 240 is supported by the base 230.

Next, terminals 223 and 224, protruding from through holes of the control board 240, of the power module board 220, are electrically connected to the control board 240 by soldering. Hence, the control board 240 and the power module board 220 are electrically connected. In addition, the upper ends of the terminals 232, protruding from openings of the control board 240, of the output connector 231 are electrically connected to the control board 240 by soldering.

Then, the power and signal connector 241 on the control board 240 is fit in an opening, not illustrated, of the cover 250, so as to assemble the case 210 and the cover 250. Thus, the power module board 220, the base 230, and the control board 240 are accommodated in the case 210 and the cover 250. The output connector 231 and the power and signal connector 241 protrude outward from the case 210 and cover 250, and the assembly operation of the electronic control unit 200 completes.

Additionally, as a connector for use in an electric connection box mounted on an automobile, for example, the box (see PLT 2) illustrated in FIG. 12 is known, in one technology. FIG. 12 is a cross-sectional view of an example of a connector, in one technology.

A connector 301 illustrated in FIG. 12 includes a connector housing 310 and plural terminals 320 attached to the connector housing 310.

The connector housing 310 is integrally formed by resin with an upper case 302, where the upper case 302 and a lower case 303 accommodate a circuit board PCB, and includes a hood section 312 having a mating connector fit cavity 311 into which a mating connector 340 is fit.

In addition, each terminal 320 includes a first protrusion section 321 backwardly protruding from a back wall 313 of the hood section 312, and a second protrusion section 322 downwardly bent substantially perpendicularly from a back end part of the first protrusion section 321 and connected to a circuit board 330.

Then, the connector housing 310 is provided with a protection wall 314 backwardly extending from the back wall 313 of the hood section 312 and covering upper side, both left and right sides, and back side of the first protrusion section 321 and the second protrusion section 322.

Further, as a supplementary module for preventing entrance of foreign materials such as water, dusts, or the like, for example, the module in one technology (see PLT 3) illustrated in FIG. 13 is known. FIG. 13 is an exploded perspective view of an example of the supplementary module, in one technology.

In the supplementary module 401 illustrated in FIG. 13, a circuit board 403 is attached to a camera (i.e., supplementary module) 402, and a connector 410 is mounted on the circuit board 403. The connector 410 includes a housing 411, and plural pin terminals 412 attached to the housing 411, and each pin contact 412 is soldered and connected onto the circuit board 402.

Then, the camera 402, the circuit board 403, and the connector 410 are accommodated in a camera case 420. The camera 402, the circuit board 403, and the connector 410 are attached to the camera case 420 with four attachment screws (not illustrated) by locating four through openings 402a formed at the circumference of the camera 402 at four screw openings 420a formed in the camera case 420, respectively.

In addition, the camera case 420 is configured to be attached to the cover 430 with four attachment screws (not illustrated) through four screw openings 420b formed at the circumference of the camera case 420 and four through holes 430a formed in the cover 430.

CITATION LIST

Patent Literature

PTL 1: JP 2008-4364 A
PTL 2: WO 2012/011395
PTL 3: JP 2002-231375 A

DESCRIPTION OF EMBODIMENTS

It is to be noted that, however, in the electronic control unit (i.e., ECU) in the electric power steering apparatus, three following issues are conceivable and the development of the electronic control unit is demanded to address the issues.

1. In the electronic control unit, the board to which the terminals are connected and the case in which the board is accommodated and secured are different in thermal expansion coefficient. When heat is applied to the electronic control unit, the solder joint part of the terminal and the board is displaced. Besides, when an external force is exerted to a connector mounted on the board or a wire harness fit into this connector, the solder joint part of the terminal and the board is displaced via the terminal provided at the connector. Then, there is a drawback in that when the solder joint part of the terminal and the board is displaced, a crack occurs at the solder joint part to lead to short circuit or disconnection.

2. There are some electric power steering apparatuses, in one technology, in which the electric motor and the electronic control unit are directly connected to suppress the generation of inappropriate steering assistance torque caused by radio noise or the like, or the electric motor and the electronic control unit are arranged in proximity to each other for the reason of efficiency in product packaging. In accordance with this, the electronic control unit has to be attached to a base flange of the electric motor or the reduction gear to which the electric motor is coupled. Also in this case, the coupling strength of the electronic control unit resistant to an external force is demanded.

3. A distributor such as a relay is provided in the electronic control unit for controlling the electric motor to make the power supply current flow in the electric motor, and heat resistance is demanded for the electronic control unit, as heat is generated when the electric motor is operated.

Figure 11:
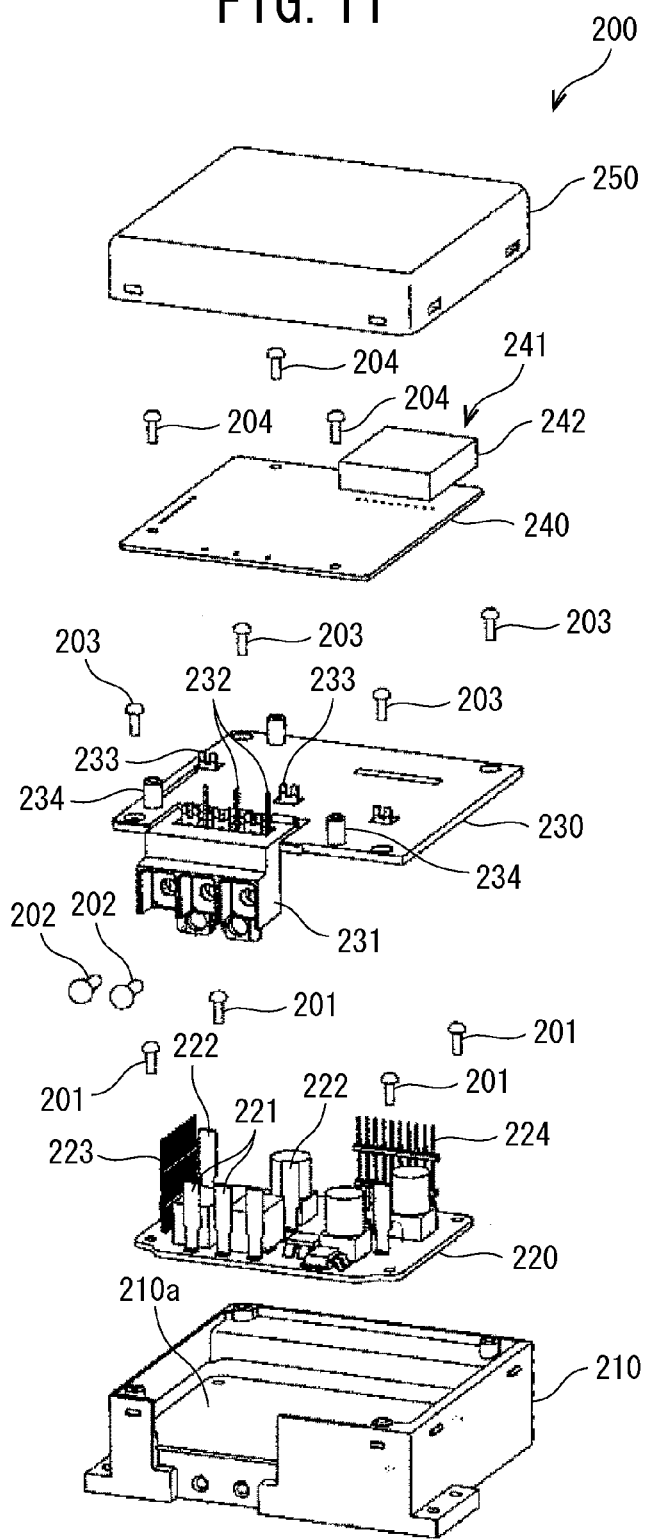
FIG. 11 is an exploded perspective view of an example of the electronic control unit in the electric power steering apparatus, in one technology.

In this situation, in the electronic control unit 200 in the electric power steering apparatus, in one technology, illustrated in FIG. 11, as described above, the power supply and signal connector 241 is mounted beforehand on the control board 240, before the control board 240 is accommodated in the case 210. For this reason, when the control board 240 is accommodated in the case 210, an external force is exerted onto the power supply and signal connector 241, and the solder joint parts of the above-described terminals and the control board 240 might be displaced, via the power supply terminal and the signal terminal provided in the connector 241. When the solder joint parts of the power supply terminal and the signal terminal, and the control board 240 are displaced, there is a drawback that a crack occurs at the solder joint parts to lead to short circuit or disconnection.

Figure 12:
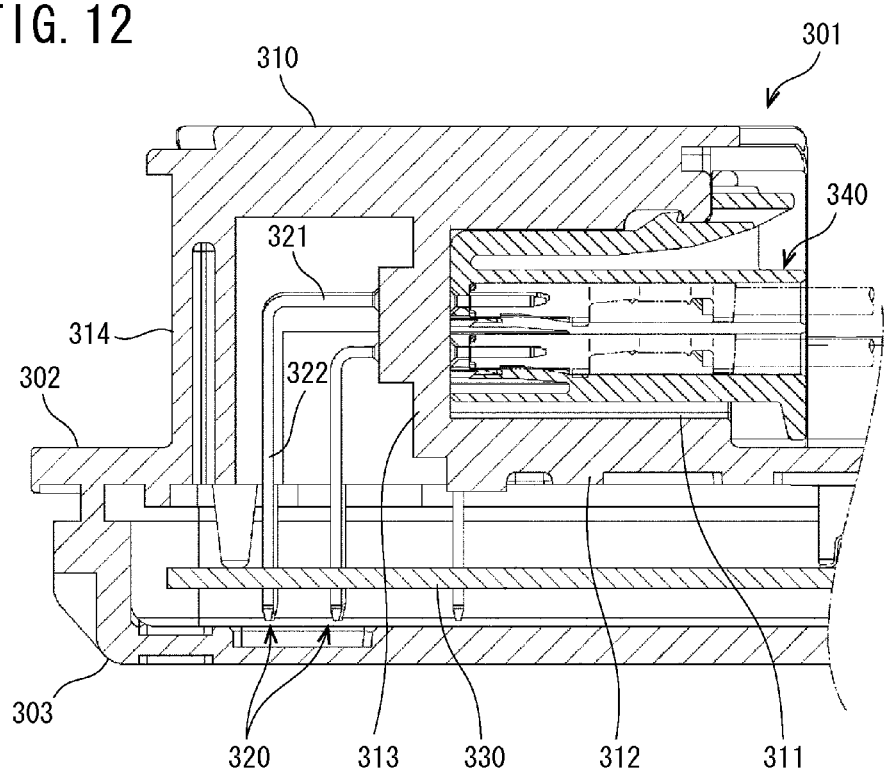
FIG. 12 is a cross-sectional view of an example of a connector, in one technology.

Besides, each terminal 320 is formed to have a substantially letter L shape in the connector 301 illustrated in FIG. 12, the displacements that occur at the solder joint parts of the respective terminals 320 and the circuit board 330 can be alleviated. However, as the upper case 302 for accommodating the connector housing 310 and the circuit board PCB are integrally formed by resin, the heat radiation effect is not obtainable and it is difficult to use as an electronic control unit. Besides, the strengths of the connector housing 310, the upper case 302, and the lower case 303 are small, when they are arranged in proximity to the electric motor, the coupling strength may not be obtainable.

Figure 13:
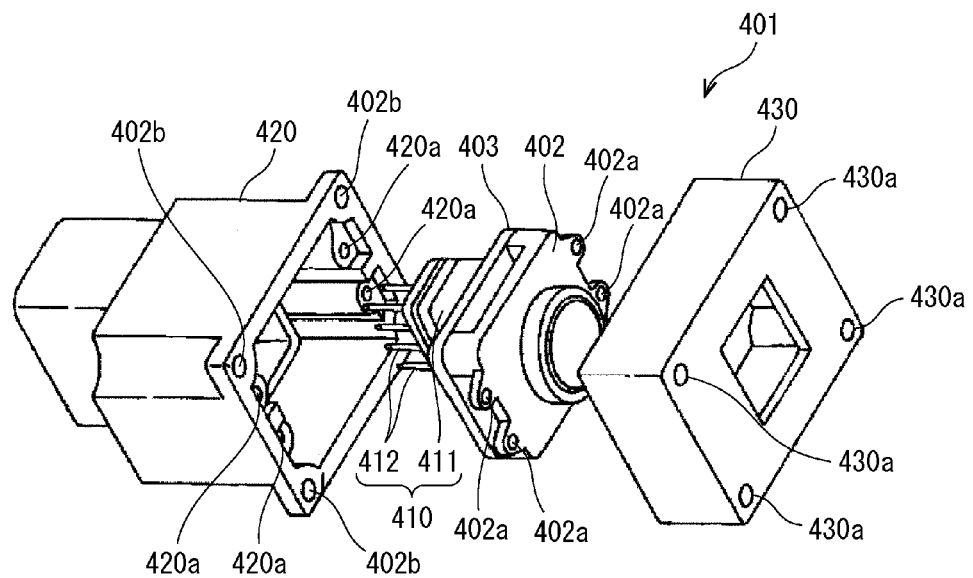
FIG. 13 is an exploded perspective view of an example of the supplementary module, in one technology.

Further, in the supplementary module 401 illustrated in FIG. 13, the camera 402, the circuit board 403, and the connector 410 are attached onto the camera case 420 with the four attachment screws (not illustrated), by locating the four through openings 402a arranged at the circumference of the camera 402 at the four screw openings 420a formed in the camera case 420, respectively. For this reason, when heat is applied, there is a drawback that the connector 410 is displaced with being secured to the camera case 420, the relative displacement with the circuit board 403 becomes large, an excessive stress is produced at the joint parts of the terminals 412 attached to the connector 410 and the circuit board 403, and a crack occurs at the joint parts to lead to short circuit or disconnection.

Therefore, the present disclosure has been made in view of the above-described drawbacks in some technologies, and has an object to provide a motor controller and a production method thereof capable of lowering the stress applied to joint parts of the terminals and the board as much as possible, even if a thermal load or external force is applied onto the connector, and in addition, achieving a sufficient coupling strength when arranged in proximity to the electric motor.

In order to address the above issues, in one embodiment of the present disclosure, there is provided a motor controller, including: a case to which a power module board and a control board are attached, the power module board mounting a power device for making a drive current flow to an electric motor, the control board mounting an electronic part for controlling driving of the electric motor; a connector configured to be inserted into a connector receiving depression section provided in the case; a connector housing having a power supply connector receiving depression section and at least one signal connector receiving depression section, with the connector being inserted into the connector receiving depression section; a plurality of terminals configured to be secured to the connector housing and soldered for connection with the control board; a first securing section and a second securing section configured to secure the connector to the case at an outer circumference of the connector housing; and a positioning section configured to position the connector to the case, when the connector is inserted into the connector receiving depression section, wherein the first securing section is arranged at the outer circumference of the connector housing and in vicinity of the at least one signal connector receiving depression section, and wherein the second securing section and the positioning section are arranged at the outer circumference of the connector housing and in vicinity of the power supply connector receiving depression section.

According to the above-described motor controller, the power module board and the control board are attached onto the case, and then the connector is inserted into the connector receiving depression section arranged in the case. For this reason, when the connector is inserted, the control board and the terminals provided in the connector are not connected. Even if an external force is exerted, no stress will work on parts to be connected.

In addition, when thermal load is applied after the connector is inserted and secured onto the connector receiving depression section of the case and the terminals of the connector and the control board are connected, displacement occurs at joint parts of the terminals and the control board when heat is applied to the electronic control unit, because the control board to which the terminals are connected and the case to which the control board is attached are different in thermal expansion coefficient. Further, when an external force is exerted to the connector after the connector is inserted and secured onto the connector receiving depression section of the case and the terminals of the connector and the control board are connected, displacement occurs at joint parts of the terminals and the control board. However, the connector screwed and secured onto the case via the first securing section and the second securing section is capable of absorbing the displacement. Hence, even in the case where the thermal load is applied or external force is exerted to the connector, the stress to work on the joint parts of the terminals and the control board can be made small as much as possible. Furthermore, there are two sections including the first securing section and the second securing section used for screwing and securing the connector onto the case. Therefore, it is relatively difficult for the connector to follow the displacement of the case.

Moreover, as the connector housing includes the positioning section for positioning the connector to the case when the connector is inserted into the connector receiving depression section, it is possible to position the connector to the case.

Further, the first securing section is arranged at the outer circumference and in vicinity of the at least one signal connector receiving depression section, and the second securing section and the positioning section are arranged at the outer circumference of the connector housing and in vicinity of the power supply connector receiving depression section. A large current flows across the terminal secured onto the power supply connector receiving depression section, and therefore the terminal having a large cross section and a large outer shape is used. Accordingly, such a terminal is easily affected by the stress due to the attachment or vibration. Thus, the second securing section and the positioning section are arranged in the vicinity of the power supply connector receiving depression section of the connector housing. Not only securing by the second securing section but also the positioning function of the positioning section is added to enhance the securing of the power supply connector receiving depression section side of the connector housing. On the other hand, a small current flows across the terminal secured onto the signal connector receiving depression section and a small-sized terminal is used, and such a small terminal is hardly affected by the stress due to the attachment or vibration. Therefore, the first securing section is merely arranged in the vicinity of the signal connector receiving depression section of the connector housing and the connector is secured onto the case by the second securing section, so that the signal connector receiving depression section side of the connector housing is made relatively flexible.

In addition, according to the above-described motor controller, the connector is configured to be inserted and secured onto the connector receiving depression section of the case, and the case and the connector are separately formed. For this reason, the electric motor is configured to be attached onto the case side to improve the strength of the case side. Hence, when the case is arranged in the vicinity of the electric motor, a sufficient coupling strength is obtainable.

In the above-described motor controller, the first securing section and the second securing section may be configured to be reinforced by ribs, respectively, and are arranged at the outer circumference of the connector housing, and a first rib configured to reinforce the first securing section may be smaller than a second rib configured to reinforce the second securing section.

According to the above-described motor controller, the first securing section and the second securing section can be reinforced by the ribs, respectively. In addition, the rib for the first securing section on the signal connector receiving depression section side through which a small current flows is made small, and the signal connector receiving depression section side of the connector housing is easily deformable.

In addition, in the above-described motor controller, a flange configured to sit on a flat section provided at a surrounding wall that configures the connector receiving depression section of the case may be provided at the outer circumference of the connector housing.

According to the above-described motor controller, when the connector is inserted and secured onto the connector receiving depression section of the case, the flange sits on the flat section. For this reason, the dust-proof performance of in-between the rim of the connector receiving depression section of the case and the flange of the connector can be improved.

Further, in the above-described motor controller, the case may be formed to have a substantially rectangular shape, and has an electric motor arrangement space, in which the electric motor is arranged, in one face of the case.

Furthermore, in the above-described motor controller, the connector receiving depression section may be configured such that the one face side of the case opens at one end part in a length direction of the case in vicinity of the electric motor arrangement space in the one face of the case.

In addition, in the above-described motor controller, the connector housing may be formed to have a substantially rectangular shape, the connector receiving depression section may be formed to have a substantially rectangular shape, and when the connector may be inserted and secured, the length direction of the connector may be configured to be parallel to a motor axis of the electric motor to be arranged in the electric motor arrangement space.

Further, the above-described motor controller may further include a pair of motor securing sections configured to secure the case onto the electric motor to be arranged in the electric motor arrangement space is provided in one face of the case and on both sides of the electric motor arrangement space.

Furthermore, in the above-described motor controller, the pair of motor securing sections may be coupled by a reinforcement rib extending from one face of the case.

Moreover, in the above-described motor controller, a heat radiation fin may be provided in one face of the case.

In addition, in another embodiment of the present disclosure, there is provided a production method of the above-described motor controller, the production method comprising: attaching the power module board and the control board to the case; and inserting the connector into the connector receiving depression section arranged in the case, wherein the inserting includes: inserting the connector into the connector receiving depression section arranged in the case, while positioning the positioning section arranged at the connector to the case when the connector is inserted into the connector receiving depression section; screwing and securing the connector onto the case via the first securing section and the second securing section; and connecting each of the plurality of terminals provided in the connector to the control board.

According to a motor controller and a production method thereof in some embodiments of the present disclosure, it is possible to provide a motor controller and a production method thereof capable of lowering the stress applied to joint parts of the terminals and the board as much as possible, even if a thermal load or external force is applied onto the connector, and in addition, achieving a sufficient coupling strength when arranged in proximity to the electric motor.

Figure 1:
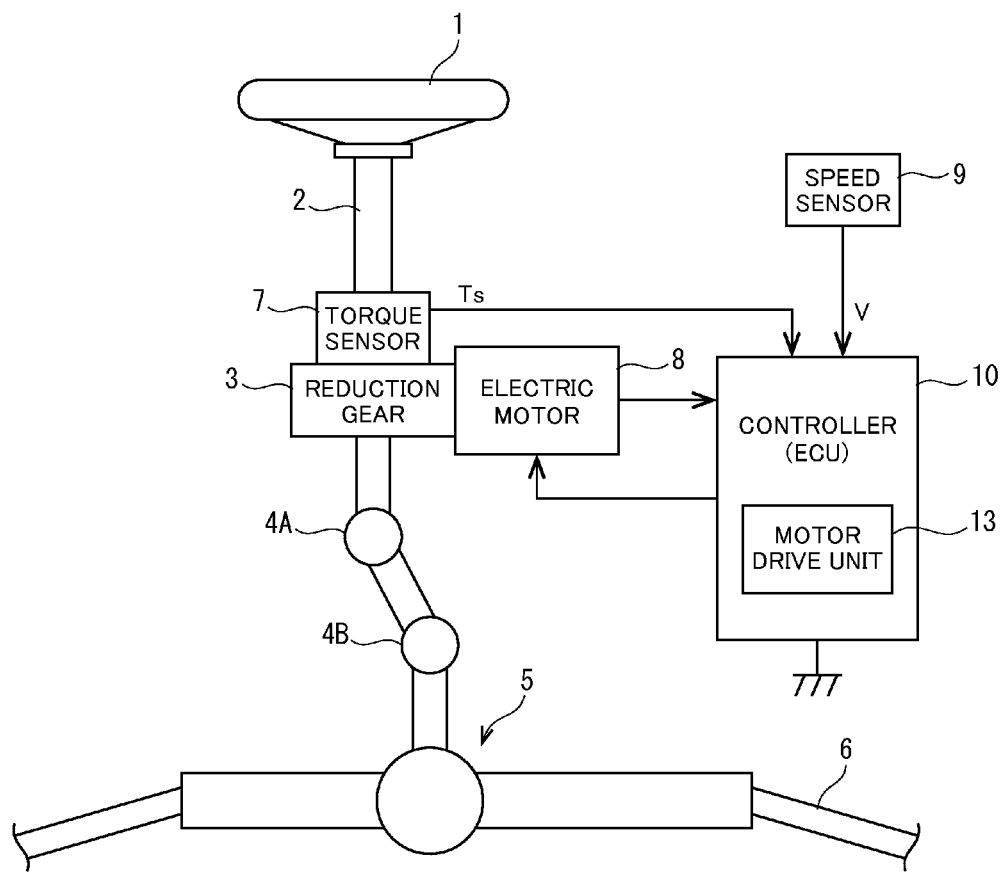
FIG. 1 is a view illustrative of the basic structure of an electric power steering apparatus in which an electronic control unit is used as a motor controller according to the present disclosure.
Figure 2:
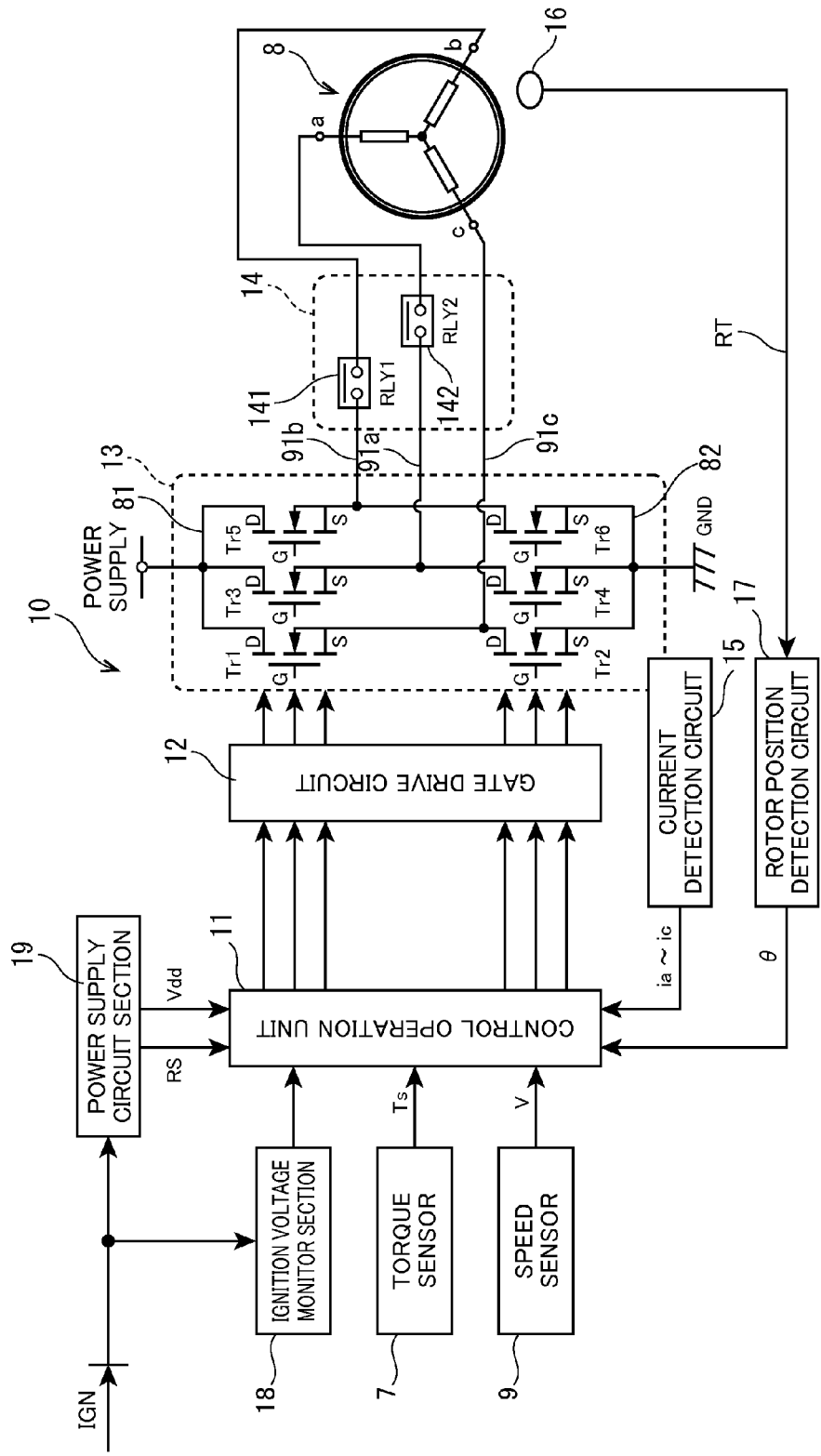
FIG. 2 is a block diagram illustrative of a control system of the electronic control unit of the electric power steering apparatus illustrated in FIG. 1.
Figure 3:
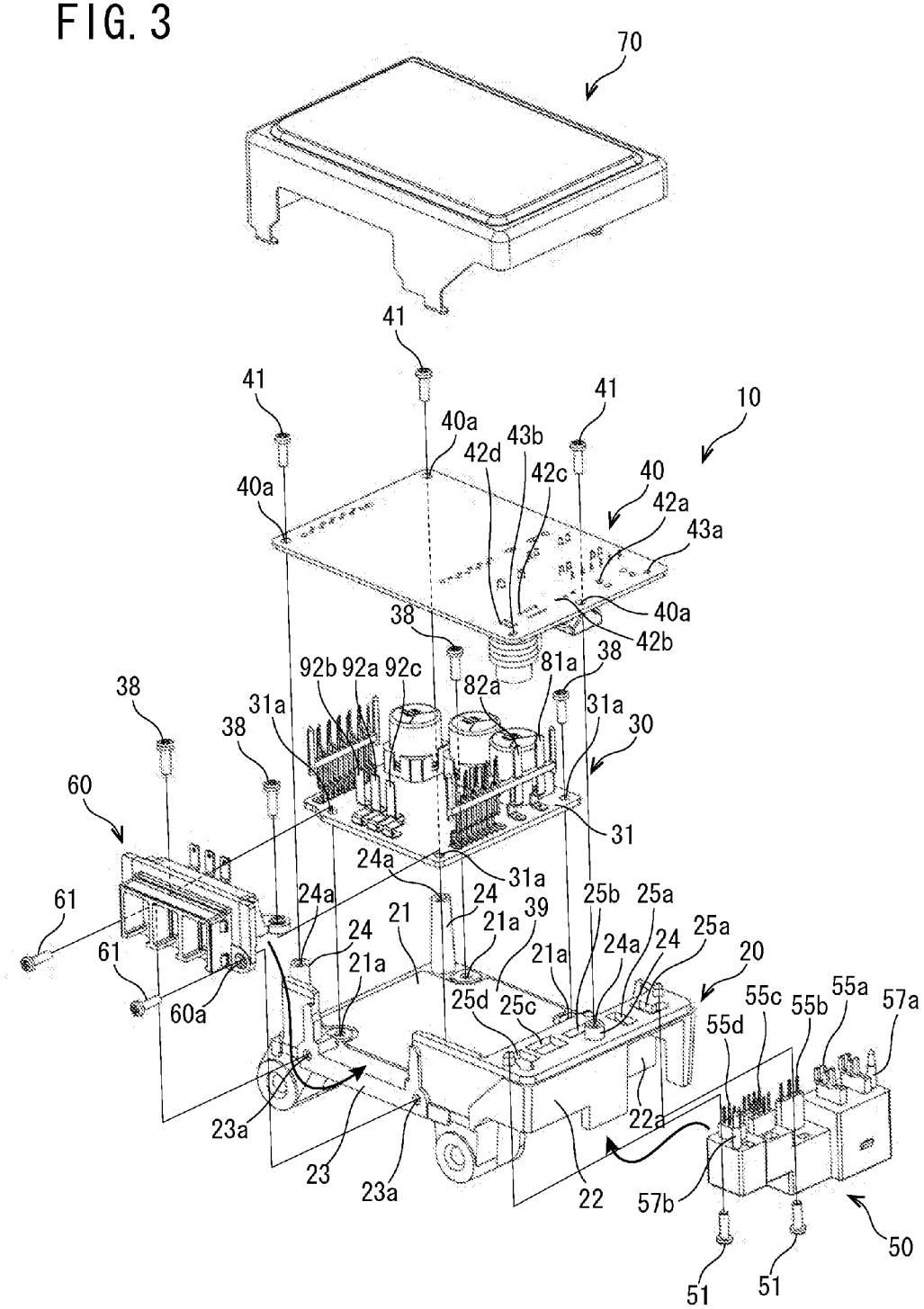
FIG. 3 is an exploded perspective view of the electronic control unit of the electric power steering apparatus illustrated in FIG. 1.
Figure 4:
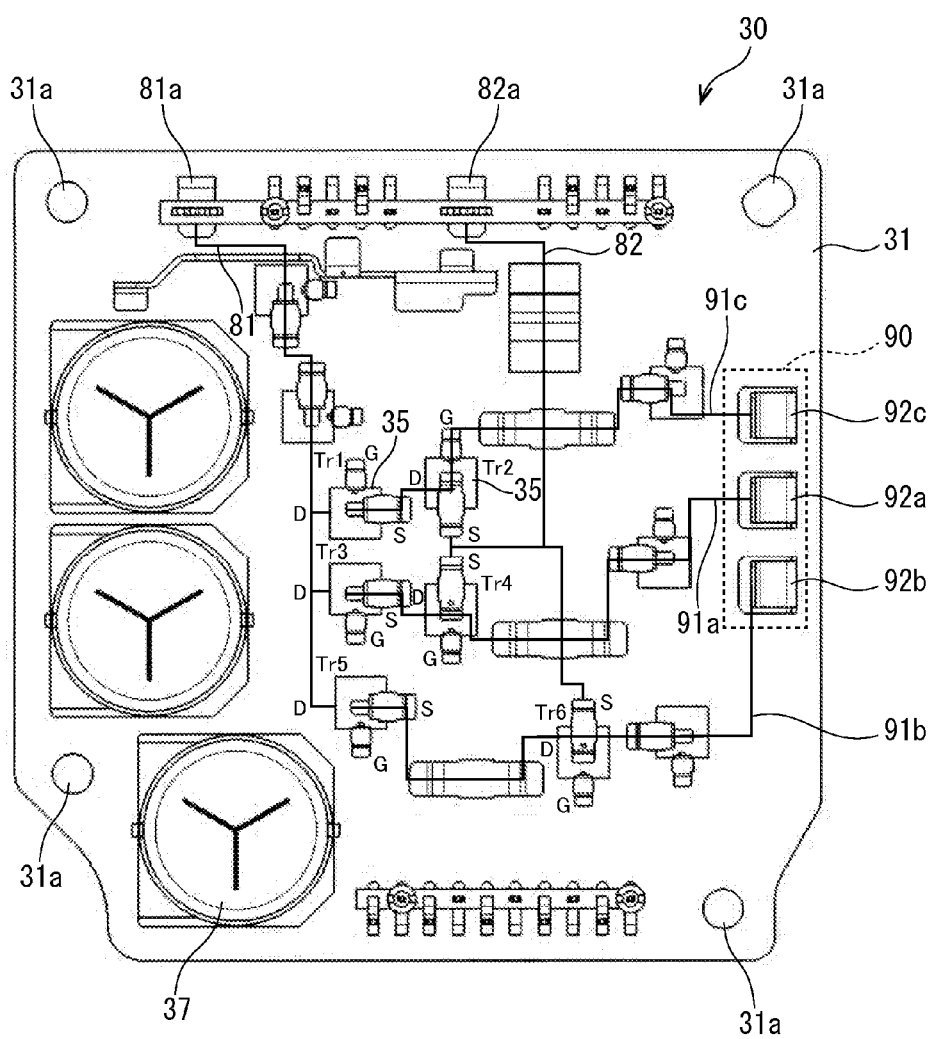
FIG. 4 is a plane view of a power module board in the electronic control unit illustrated in FIG. 3.
Figure 5:
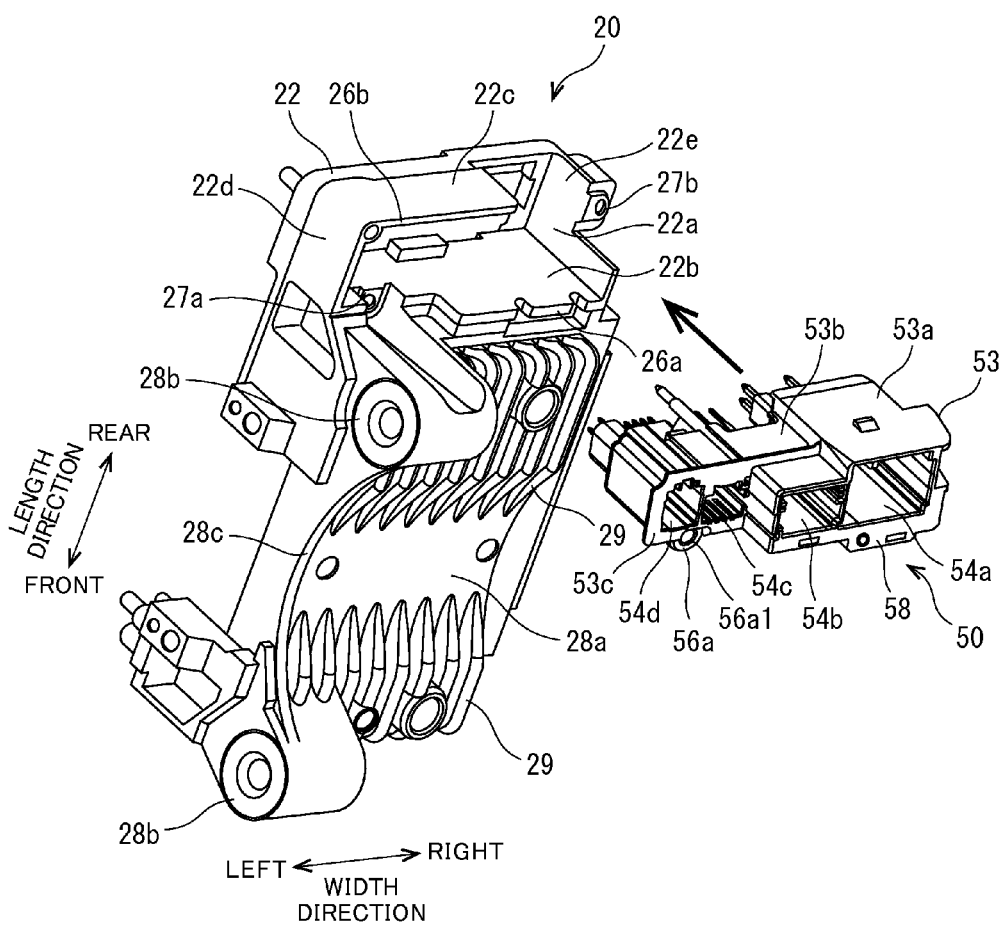
FIG. 5 is a perspective diagram illustrative of a case and a power supply and signal connector in the electronic control unit illustrated in FIG. 3.

Hereinafter, embodiments of the present disclosure will be described with reference to the attached drawings. FIG. 1 is a view illustrative of the basic structure of an electric power steering apparatus in which an electronic control unit is used as a motor controller according to the present disclosure. FIG. 2 is a block diagram illustrative of a control system of the electronic control unit of the electric power steering apparatus illustrated in FIG. 1. FIG. 3 is an exploded perspective view of the electronic control unit of the electric power steering apparatus illustrated in FIG. 1. FIG. 4 is a plane view of a power module board in the electronic control unit illustrated in FIG. 3. FIG. 5 is a perspective diagram illustrative of a case and a power supply and signal connector in the electronic control unit illustrated in FIG. 3.

The basic structure of an electric power steering apparatus in which an electronic control unit is used as a motor controller according to the present disclosure is illustrated in FIG. 1. In the electric power steering apparatus, a column shaft 2 of a steering wheel 1 is connected to a tight rod 6 of a steering wheel through a reduction gear 3, universal joints 4A and 4B, and a rack and pinion mechanism 5. A torque sensor 7 that detects a steering torque of the steering wheel 1 is provided in the column shaft 2, and an electric motor 8 that assists a steering force of the steering wheel 1 is connected to the column shaft 2 via the reduction gear 3. Power is supplied from a battery (not illustrated) as a power supply to an electronic control unit (i.e., ECU: Electronic Control Unit) 10 that controls the electric power steering device, and an ignition key signal IGN (see FIG. 2) is input to the controller 10 through an ignition key (not illustrated). The electronic control unit 10 calculates a steering assist instruction value that is an assist (steering assist) instruction based on a steering torque Ts detected by the torque sensor 7 and a vehicle speed V detected by a vehicle speed sensor 9, and controls a current supplied to the electric motor 8 based on the steering assist instruction value that has been calculated.

The electronic control unit 10 mainly includes a microcomputer, but FIG. 2 illustrates the mechanism and configuration of the control unit.

The steering torque Ts detected by the torque sensor 7 and the vehicle speed V detected by the vehicle speed sensor 9 are input to a control operation unit 11 as a control calculator, and the current instruction value calculated by the control operation unit 11 is input into a gate drive circuit 12. A gate drive signal formed in the gate drive circuit 12 based on the current instruction value and the like is input to a motor drive unit 13 having a bridge configuration of FET. The motor drive unit 13 drives the electric motor 8 including a three-phase brushless motor through a cutoff device 14 for emergency stop. Each phase current of the three-phase brushless motor is detected by a current detection circuit 15, and the detected three phase motor currents is to is are input as feedback currents to the control operation unit 11. In addition, a rotation sensor 16 such as a hall sensor is attached to the three-phase brushless motor, so that a rotation signal RT from the rotation sensor 16 is input to a rotor position detection circuit 17 and the detected rotation position θ is input to the control operation unit 11.

In addition, the ignition signal IGN from an ignition key is input to an ignition voltage monitor section 18 and a power supply circuit section 19. When a power supply voltage Vdd is input to the control operation unit 11 from the power supply circuit section 19, a reset signal Rs for device stop is input to the control operation unit 11. Further, the cutoff device 14 includes relay contacts 141 and 142 for interrupting the two phases.

Moreover, the circuit configuration of the motor drive unit 13 will be described. To a power line 81, serially-connected FETs Tr1 and Tr2, FETs Tr3 and Tr4, and FETs Tr5 and Tr6 are connected in parallel. In addition, to the power line 81, FETs Tr1 and Tr2 connected in parallel, FETs Tr3 and Tr4, and FETs Tr5 and Tr6 are connected to a ground line 82. Thus, an inverter is formed. Here, as to the FETs Tr1 and Tr2, a source electrode S of the FET Tr1 and a drain electrode D of the FET Tr2 are serially connected to form a c-phase arm of the three-phase motor, and an electrical current is output in a c-phase output line 91c. Further, as to the FETs Tr3 and Tr4, a source electrode S of the FET Tr3 and a drain electrode D of the FET Tr4 are serially connected to form an a-phase arm of the three-phase motor, and an electrical current is output in an a-phase output line 91a. Furthermore, as to the FETs Tr5 and Tr6, a source electrode S of the FET Tr5 and a drain electrode D of the FET Tr6 are serially connected to form a b-phase arm of the three-phase motor, and an electrical current is output in a b-phase output line 91b.

Next, FIG. 3 is an exploded perspective view of the electronic control unit 10. The electronic control unit 10 includes a case 20, a power module board 30 on which a power device for making the drive current flow to the electric motor 8 including the motor drive unit 13 is mounted, a heat radiation sheet 39, a control board 40 on which electronic parts for controlling driving of the electric motor 8 including the control operation unit 11 and the gate drive circuit 12 are mounted, a power supply and signal connector 50, a three-phase output connector 60, and a cover 70.

Here, the case 20 is formed to have a substantially rectangular shape, and includes on a surface side of the case 20, a power module board mount section 21 having a plate shape on which the power module board 30 is mounted. The case 20 further includes a power supply and signal connector mount section 22, provided at a rear end in the length direction of the power module board mount section 21, for mounting the power supply and signal connector 50, and a three-phase output connector mount section 23, provided at a left end part in the width direction of the power module board mount section 21, for mounting the three-phase output connector 60.

In addition, plural screw openings 21a into which attachment screws 38 for attaching the power module board 30 are to be screwed are arranged in the power module board mount section 21. Further, plural attachment posts 24 for attaching the control board 40 stand up in the semiconductor module mount section 21 and the power supply and signal connector mount section 22, and plural screw openings 24a into which attachment screws 41 for attaching the control board 40 are to be screwed are provided in the attachment posts 24, respectively. Furthermore, plural screw openings 23a into which attachment screws 61 for attaching the three-phase output connector 60 are to be screwed are provided in the three-phase output connector mount section 23.

In addition, the power supply and signal connector mount section 22 of the case 20, as illustrated in FIG. 5, includes a connector receiving depression section 22a into which the power supply and signal connector 50 is to be inserted and secured on a back face side of the case 20. On the back face of the case 20, an electric motor arrangement space 28a in which the electric motor (see FIG. 10) 8 is arranged. The connector receiving depression section 22a is formed so that the back face side opens at the rear end part in the length direction of the case 20 in the vicinity of the electric motor arrangement space 28a. The connector receiving depression section 22a is formed to have a substantially rectangular parallelepiped shape, as illustrated in FIG. 5, and is configured with a length direction back end wall 22c at a back end in the length direction of the case 20, a width direction left end wall 22d at a left end wall in the width direction of the case 20, a width direction right end wall 22e at a right end wall in the width direction of the case 20, and a front end wall 22b slightly on the near side from the length direction back end wall 22c of the case 20. In addition, as illustrated in FIG. 5, when the power supply and signal connector 50 having a substantially rectangular parallelepiped shape is inserted and secured in the connector receiving depression section 22a, the connector receiving depression section 22a is arranged such that the length direction of the power supply and signal connector 50 is parallel to a motor axis of the electric motor 8 (see FIG. 10) arranged in the electric motor arrangement space 28a.

Then, as illustrated in FIG. 5, a first securing section 27a for screwing and securing the power supply and signal connector 50 is formed to protrude on a part closer to a left end part in the width direction of the front end wall 22b configuring the connector receiving depression section 22a of the case 20. In the first securing section 27a, a female screw section into which an attachment screw 51 to be described below is to be screwed is formed. Further, a second securing section 27b for screwing and securing the power supply and signal connector 50 is formed to protrude on apart slightly closer to the back side in the length direction of the width direction right end wall 22e configuring the connector receiving depression section 22a of the case 20. In the second securing section 27b, a female screw section into which the attachment screw 51 to be described below is to be screwed is formed.

Furthermore, when the power supply and signal connector 50 is inserted into the connector receiving depression section 22a, as illustrated in FIG. 5, a positioning protrusion section 26a to be fit in the positioning section 58 of the power supply and signal connector 50 to be described below is provided at an upper end of the front end wall 22b configuring the connector receiving depression section 22a. The positioning protrusion section 26a is provided in the vicinity of the second securing section 27b closer to the right end in the width direction of the front end wall 22b, and is formed to be a projection having a rectangular shape to be easily fit into the positioning section 58.

Further, top faces of parts closer to the left end in the width direction of the back end wall 22c, the left end wall 22d, and the front end wall 22b which are surrounding walls for configuring the connector receiving depression section 22a are a flat section 26b on which a flange 53c of a connector housing 53 to be described below sits. The width of the flat section 26b is slightly larger than the width of the flange 53c so that the flange 53c can sit on the flat section 26b with certainty.

Furthermore, the case 20 secures heat radiation characteristics, and is made by aluminum die-casting so that even a complicated shape can be formed well. Then, as illustrated in FIG. 5, a heat radiation fin 29 is arranged in a large part of the back face of the case 20 except for the connector receiving depression section 22a and electric motor arrangement space 28a. Generated heat from the power module board 30 mounted on the power module board mount section 21 of the case 20 is transmitted to the case 20, and is radiated via the heat radiation fin 29. The provision of the heat radiation fin 29 increases the heat radiation area.

Then, as illustrated in FIG. 5, on the back face of the case 20 and on both sides of the electric motor arrangement space 28a at a left edge part in the width direction of the case 20, a pair of motor securing sections 28b is provided for securing the case 20 at the electric motor 8 to be arranged at the electric motor arrangement space 28a. The pair of motor securing sections 28b is coupled by a reinforcement rib 28c extending from the back face of the case 20. An end part of the reinforcement rib 28c is cut out to have an arc shape so that the electric motor 8 formed in cylindrical shape can be arranged in the electric motor arrangement space 28a smoothly.

Further, as illustrated in FIG. 3, when the power supply and signal connector 50 is inserted and secured into the connector receiving depression section 22a, on the surface side of the power supply and signal connector mount section 22 of the case 20, there are provided a first through opening 25a through which a power supply terminal 55a and a first insertion guide post 57a, to be described later, of the power supply and signal connector 50 can be inserted, a second through opening 25b through which an automobile communication signal terminal 55b of the power supply and signal connector 50 can be inserted, a third through opening 25c through which a torque signal terminal 55c of the power supply and signal connector 50 can be inserted, a fourth through opening 25d through which a resolver signal terminal 55d of the power supply and signal connector 50 and the second insertion guide post 57b can be inserted.

In addition, the power module board 30 has a circuit configuration of the above-described motor drive unit 13. As illustrated in FIG. 4, six FETs Tr1 to Tr6, a positive terminal 81a connected to the power line 81, and a negative terminal 82a connected to the ground line 82 are mounted on a board 31. Further, a three-phase output section 90 including an a-phase output terminal 92a connected to the a-phase output line 91a, a b-phase output terminal 92b connected to the b-phase output line 91b, and a c-phase output terminal 92c connected to the c-phase output line 91c is mounted on the board 31. The board 31 is an aluminum board. Furthermore, other surface mount parts 37 including a capacitor is mounted on the board 31. Furthermore, plural through openings 31a through which the attachment screws 38 for attaching the power module board 30 are inserted are mounted on the board 31. Each of the FETs Tr1 to Tr6 includes a bare chip FET (i.e., bare chip transistor) 35. A source electrode S and a gate electrode G are provided on the bare chip FET 35. Additionally, a drain electrode, not illustrated, is provided on the bottom face of the bare chip FET 35.

Further, the control board 40 configures a control circuit including the control operation unit 11 and the gate drive circuit 12, by mounting plural electronic parts on a board. Plural through openings 40a into which the attachment screws 41 for attaching the control board 40 to the case 20 are inserted are provided in the control board 40, as illustrated in FIG. 3. Then, a first through opening 43a through which the first insertion guide post 57a of the power supply and signal connector 50 can be inserted and a second through opening 43b through which the second insertion guide post 57b can be inserted are arranged in the control board 40. Furthermore, there are provided in the control board 40, a first through hole 42a to which the power supply terminal 55a of the power supply and signal connector 50 is connected, a second through hole 42b to which the automobile communication signal terminal 55b of the power supply and signal connector 50 is connected, a third through hole 42c to which the torque signal terminal 55c of the power supply and signal connector 50 is connected, and a fourth through hole 42d to which the resolver signal terminal 55d of the power supply and signal connector 50 is connected.

Next, the power supply and signal connector 50 is used for inputting a direct-current power supply from a battery (not illustrated) to the power module board 30, and inputting various signals including signals from the torque sensor 12 and the vehicle speed sensor 9 to the control board 40.

Figure 6A:
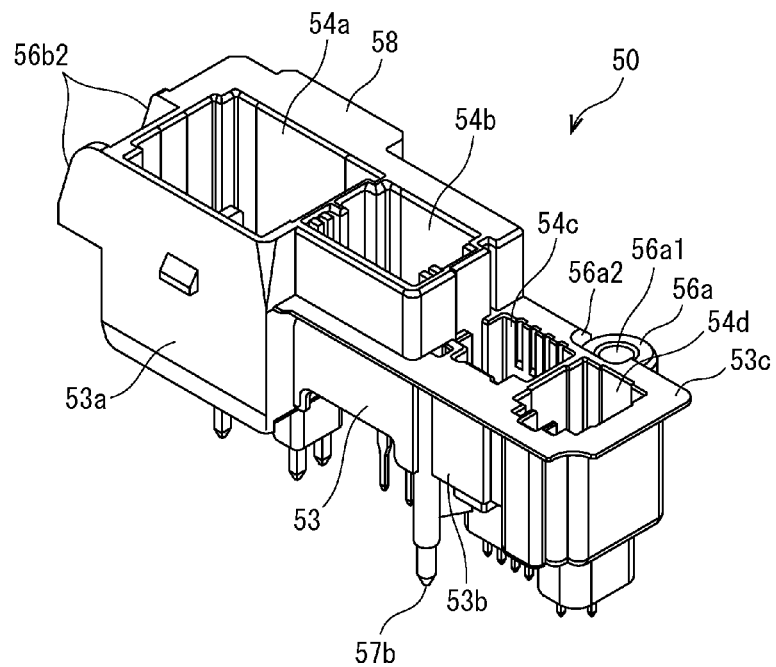
FIG. 6A is a perspective view illustrative of the power supply and signal connector illustrated in FIG. 5 when viewed from obliquely upper side of the back face.
Figure 6B:
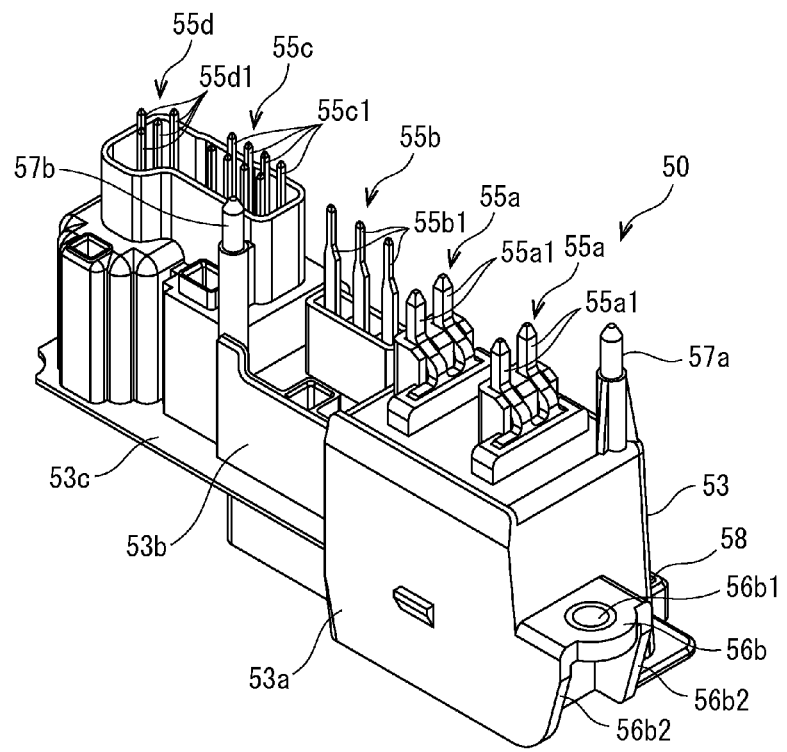
FIG. 6B is a perspective view illustrative of the power supply and signal connector illustrated in FIG. 5 when viewed from obliquely lower side of the back face.
Figure 7A:
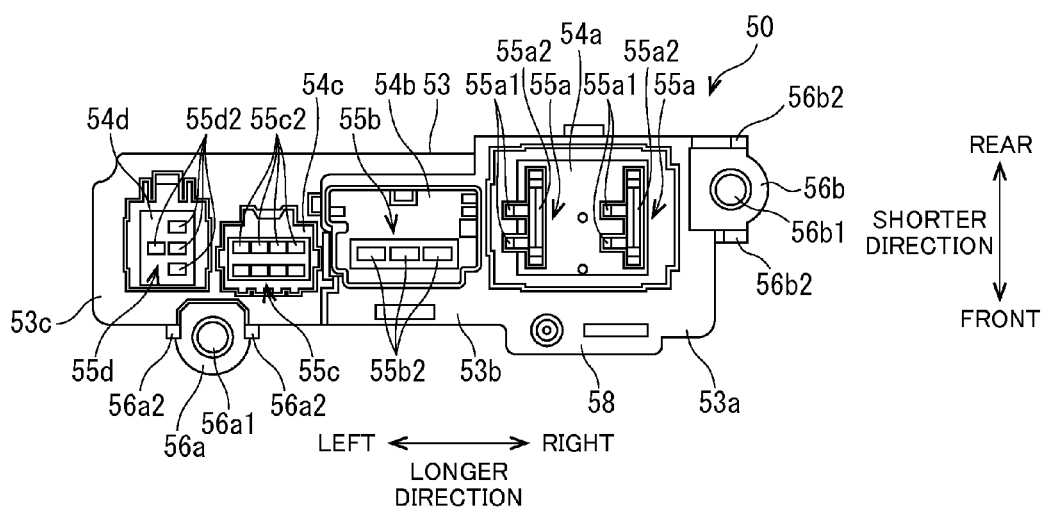
FIG. 7A is a plane view illustrative of the power supply and signal connector illustrated in FIG. 5.
Figure 7B:
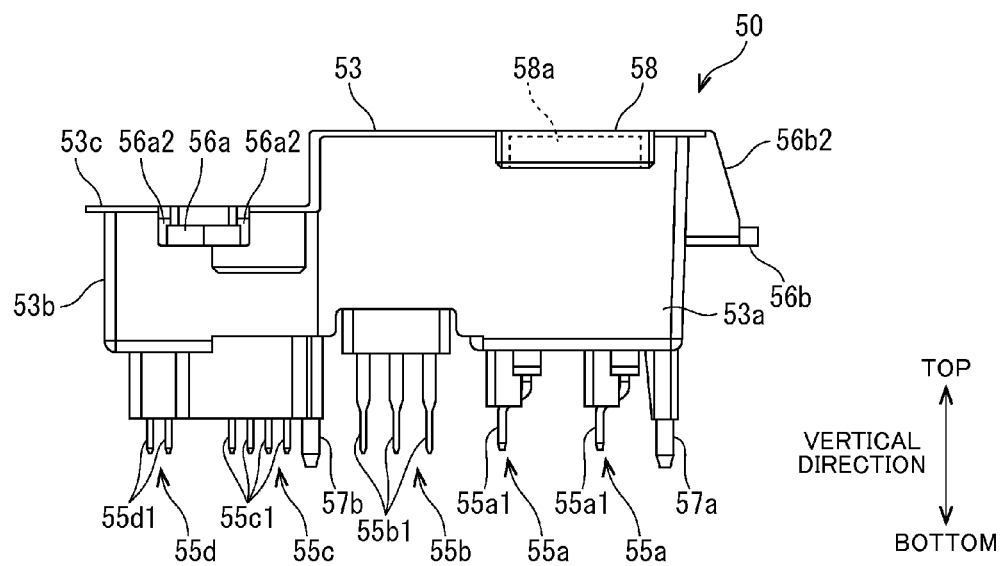
FIG. 7B is a front view illustrative of the power supply and signal connector illustrated in FIG. 5.
Figure 8A:
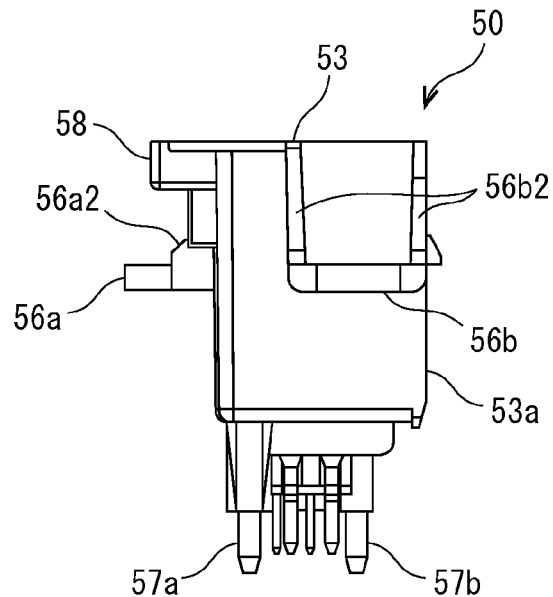
FIG. 8A is a left side view illustrative of the power supply and signal connector illustrated in FIG. 5.
Figure 8B:
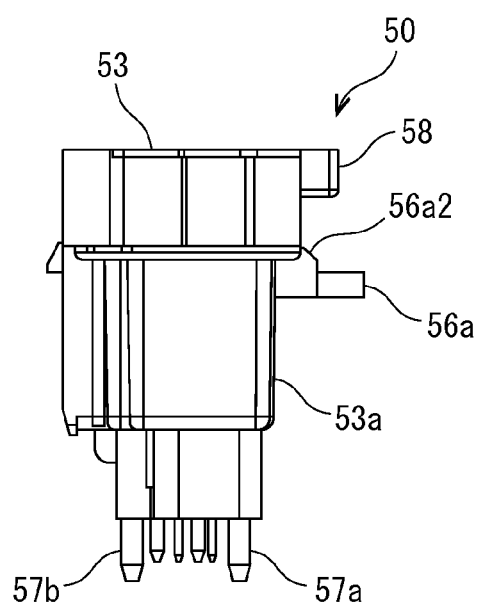
FIG. 8B is a right side view illustrative of the power supply and signal connector illustrated in FIG. 5.
Figure 9A:
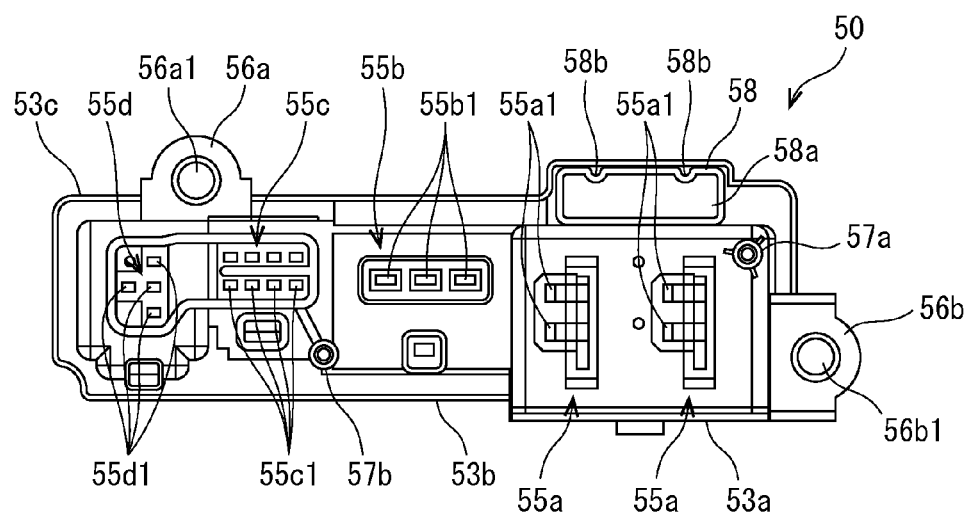
FIG. 9A is a bottom face view illustrative of the power supply and signal connector illustrated in FIG. 5.
Figure 9B:
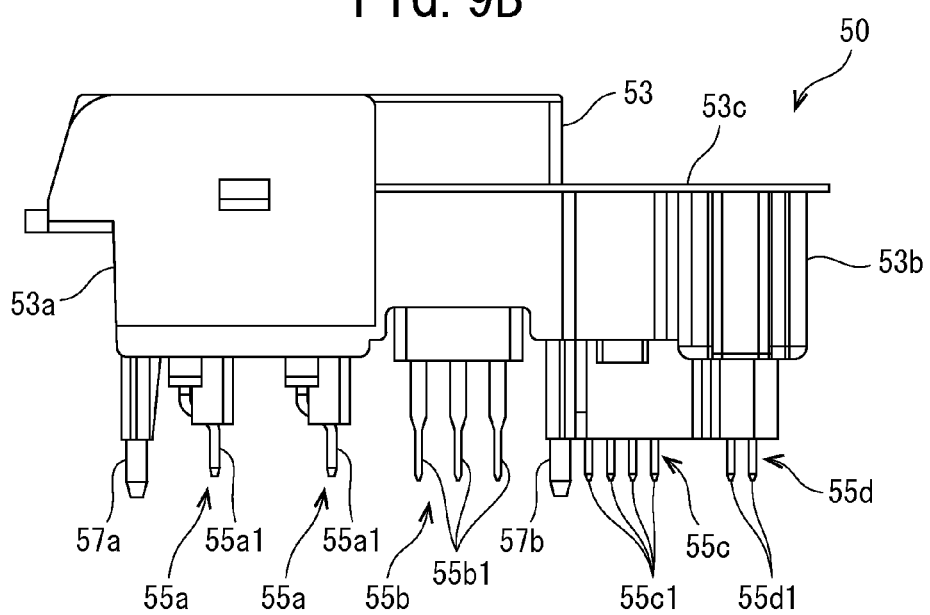
FIG. 9B is a back face view of the power supply and signal connector illustrated in FIG. 5.

Detailed configuration of the power supply and signal connector 50 will be described with reference to FIG. 5 to FIG. 9B. FIG. 6A is a perspective view illustrative of the power supply and signal connector illustrated in FIG. 5 when viewed from obliquely upper side of the back face. FIG. 6B is a perspective view illustrative of the power supply and signal connector illustrated in FIG. 5 when viewed from obliquely lower side of the back face. FIG. 7A is a plane view illustrative of the power supply and signal connector illustrated in FIG. 5. FIG. 7B is a front view illustrative of the power supply and signal connector illustrated in FIG. 5. FIG. 8A is a left side view illustrative of the power supply and signal connector illustrated in FIG. 5. FIG. 8B is a right side view illustrative of the power supply and signal connector illustrated in FIG. 5. FIG. 9A is a bottom face view illustrative of the power supply and signal connector illustrated in FIG. 5. FIG. 9B is a back face view of the power supply and signal connector illustrated in FIG. 5.

The power supply and signal connector 50 is inserted into the connector receiving depression section 22a formed in the case 20 from a back face side of the case 20, and includes a connector housing 53 and plural terminals 55a to 55d secured to the connector housing 53.

Here, the connector housing 53 is formed in substantially rectangular parallelepiped shape by molding a synthetic resin having insulating properties, and has a shape that can be inserted into the connector receiving depression section 22a formed in the case 20. The connector housing 53, as illustrated in FIG. 6A, includes a first housing body 53a having a power supply connector receiving depression section 54a, and a second housing body 53b having an automobile communication signal connector receiving depression section 54b, a torque signal connector receiving depression section 54c, and a resolver signal connector receiving depression section 54d. The second housing body 53b is formed to be thinner than the first housing body 53a, and has a shape more easily transformed than the first housing body 53a. In addition, as illustrated in FIG. 7A, the first housing body 53a is arranged on the right side in the length direction of the connector housing 53, whereas the second housing body 53b is arranged on the left side in the length direction of the connector housing 53. From the right side to the left side in the length direction of the connector housing 53, the power supply connector receiving depression section 54a, the automobile communication signal connector receiving depression section 54b, the torque signal connector receiving depression section 54c, and the resolver signal connector receiving depression section 54d are arranged in this order.

Then, the back end wall 22c and the left end wall 22d, which are surrounding walls configuring the connector receiving depression section 22a, and the flange 53c to sit on the flat section 26b are arranged at an outer circumference of the second housing body 53b, as illustrated in FIG. 5 to FIG. 9B. As illustrated in FIG. 6A, end faces on the opening sides of the torque signal connector receiving depression section 54c and the resolver signal connector receiving depression section 54d are flush with the flange 53c, whereas an end face on the opening side of the automobile communication signal connector receiving depression section 54b protrudes as compared to the flange 53c, and is flush with an end face on the opening side of the power supply connector receiving depression section 54a.

Further, as illustrated in FIG. 7A and FIG. 7B, a first securing section 56a for screwing and securing the connector 50 to the case 20 is provided at the outer circumference of the second housing body 53b and on the top of the front longer side in the shorter direction of the second housing body 53b. The first securing section 56a is arranged in the vicinity between the torque signal connector receiving depression section 54c and the resolver signal connector receiving depression section 54d. A through opening 56a1 through which the attachment screw 51 to be described below is inserted is formed in the first securing section 56a. When the power supply and signal connector 50 is inserted into the connector receiving depression section 22a formed in the case 20 as illustrated in FIG. 5, the first securing section 56a is located at a position corresponding to the position of the first securing section 27a of the case 20. As illustrated in FIG. 7A and FIG. 7B, a pair of ribs 56a2 is provided on both end parts of the first securing section 56a. These ribs 56a2 reinforce the first securing section 56a.

Furthermore, as illustrated in FIG. 7A and FIG. 7B, a second securing section 56b for screwing and securing the connector 50 to the case 20 is provided at the circumference of the first housing body 53a and on the top of the right shorter side in the longer direction of the first housing body 53a. The second securing section 56b is arranged in the vicinity of the power supply connector receiving depression section. A through opening 56b1 through which the attachment screw 51 to be described below is inserted is formed in the second securing section 56b. When the power supply and signal connector 50 is inserted into the connector receiving depression section 22a formed in the case 20 as illustrated in FIG. 5, the second securing section 56b is located to correspond to the second securing section 27b of the case 20. As illustrated in FIG. 7A, FIG. 7B and FIG. 8A, a pair of ribs 56b2 is provided on both end parts of the second securing section 56b. These ribs 56b2 reinforce the second securing section 56b.

It is to be noted that the ribs 56a2 that reinforce the first securing section 56a are smaller than the ribs 56b2 that reinforce the second securing section 56b.

Further, as illustrated in FIG. 5, FIG. 6A, FIG. 6B, FIG. 7A, FIG. 7B, FIG. 8A, FIG. 8B and FIG. 9A, a positioning section 58 for positioning the power supply and signal connector 50 to the case 20, when the power supply and signal connector 50 is inserted into the connector receiving depression section 22a, is provided in an upper end of a front longer side in a shorter direction of the first housing body 53a. A depression section 58a into which the positioning protrusion section 26a of the case 20 is engaged, when the power supply and signal connector 50 is inserted into the connector receiving depression section 22a, is provided in the positioning section 58, as illustrated in FIG. 7B and FIG. 9A. Then, the depression section 58a has a pair of projections 58b for receiving the positioning protrusion section 26a, when the positioning protrusion section 26a is engaged.

Also, as illustrated in FIG. 6A, FIG. 6B, FIG. 7A, FIG. 7B, FIG. 8A, FIG. 8B, FIG. 9A, and FIG. 9B, the first insertion guide post 57a is provided on the bottom face of the first housing body 53a, and a second insertion guide post 57b is provided on the bottom face of the second housing body 53b.

Next, plural terminals 55a to 55d secured to the connector housing 53 include plural power supply terminals 55a secured to the power supply connector receiving depression section 54a, plural automobile communication signal terminals 55b secured to the automobile communication signal connector receiving depression section 54b, plural torque signal terminals 55c secured to the torque signal connector receiving depression section 54c, and plural resolver signal terminals 55d secured to the resolver signal connector receiving depression section 54d.

Here, each power supply terminal 55a includes a connection section 55a1, protruding downward on the lower side of the connector housing 53, to be connected to the first through hole 42a of the control board 40, and a contact section 55a2, extending in the power supply connector receiving depression section 54a, to be in contact with a terminal provided in a power supply connector (not illustrated) engaged in the power supply connector receiving depression section 54a. In addition, each automobile communication signal terminal 55b includes a connection section 55b1, protruding downward on the lower side of the connector housing 53, to be connected to the second through hole 42b of the control board 40, and a contact section 55b2, extending in the automobile communication signal connector receiving depression section 54b, to be in contact with a terminal provided in an automobile communication signal connector (not illustrated) to be engaged in the automobile communication signal connector receiving depression section 54b. Further, each torque signal terminal 55c includes a connection section 55c1, protruding downward on the lower side of the connector housing 53, to be connected to the third through hole 42c of the control board 40, and a contact section 55c2, extending in the torque signal connector receiving depression section 54c, to be in contact with a terminal provided in a torque signal connector (not illustrated) to be engaged in the torque signal connector receiving depression section 54c. Furthermore, each resolver signal terminal 55d includes a connection section 55d1, protruding downward on the lower side of the connector housing 53, to be connected to the fourth through hole 42d of the control board 40, and a contact section 55d2, extending in the resolver signal connector receiving depression section 54d, to be in contact with a terminal provided in a resolver signal connector (not illustrated) to be engaged in the resolver signal connector receiving depression section 54d.

It is to be noted that since a larger current flows in each power supply terminal 55a than in the other signal terminals, the cross section and the outer shape of each power supply terminal 55a are larger than those of the other signal terminals 55b to 55d.

Then, the three-phase output connector 60 is used to output electrical currents from the a-phase output terminal 92a, the b-phase output terminal 92b, and the c-phase output terminal 92c. The three-phase output connector 60 is attached to the three-phase output connector mount section 23 provided at a left end part in the width direction of the power module board mount section 21 by plural attachment screws 61. Plural through openings 60a into which the attachment screws 61 are respectively inserted are formed in the three-phase output connector 60.

Further, the cover 70 is attached to the case 20, to which the power module board 30, the control board 40, the power supply and signal connector 50, and the three-phase output connector 60 are attached, to cover the control board 40 from above the control board 40.

Next, a production method (an assembly method) of the electronic control unit 10 will be described with reference to FIG. 3 and FIG. 5.

Firstly, the power module board 30 is attached onto the power module board mount section 21 of the case 20. In this situation, the heat radiation sheet 39 is attached to the power module board mount section 21, and the power module board 30 is attached from above the heat radiation sheet 39. In the attachment of the power module board 30, the attachment screws 38 are screwed into the screw openings 21a arranged in the power module board mount section 21 by inserting the attachment screws 38 into the through openings 31a of the power module board 30, respectively. Thus, the power module board 30 is attached onto the power module board mount section 21 of the case 20. Through the heat radiation sheet 39, the heat generated in the power module board 30 is radiated to the case 20 via the heat radiation sheet 39.

Subsequently, the control board 40 is attached to the case 20. In the attachment, the control board 40 is located onto the plural attachment posts 24 standing up on the power module board mount section 21 and the power supply and signal connector mount section 22 from above the power module board 30, and the attachment screws 41 are screwed into the screw openings 24a arranged in the attachment posts 24 by inserting the attachment screws 41 into the through openings 40a of the control board 40, respectively. In addition, a pin contact mounted on the power module board 30 is soldered for connection with a through hole provided in the control board 40, to electrically connect a circuit of the power module board 30 with a circuit of the control board 40. Thus, the control board 40 is attached to the case 20.

Then, the power supply and signal connector 50 is inserted into the connector receiving depression section 22a formed in the case 20 from the back side of the case 20. At this time, while the power supply and signal connector 50 is being positioned for the case by engaging the positioning protrusion section 26a of the case 20 in the depression section 58a of the positioning section 58 provided in the power supply and signal connector 50, the power supply and signal connector 50 is inserted into the connector receiving depression section 22a. Then, the first insertion guide post 57a of the power supply and signal connector 50 and the power supply terminal 55a are inserted through the first through opening 25a formed in the case 20, the automobile communication signal terminal 55b is inserted through the second through opening 25b, the torque signal terminal 55c is inserted through the third through opening 25c, and the resolver signal terminal 55d and the second insertion guide post 57b are inserted through the fourth through opening 25d. Then, the first insertion guide post 57a is inserted into the first through opening 43a formed in the control board 40, and the second insertion guide post 57b is inserted into the second through opening 43b formed in the control board 40. In addition, simultaneously, the power supply terminal 55a of the power supply and signal connector 50 is inserted into the first through hole 42a formed in the control board 40, the automobile communication signal terminal 55b is inserted into the second through hole 42b, the torque signal terminal 55c is inserted into the third through hole 42c, and the resolver signal terminal 55d is inserted into the fourth through hole 42d. The insertion of the power supply terminal 55a and other signal terminals 55b to 55d of the power supply and signal connector 50 into the first to fourth through holes 42a to 42d, respectively, is guided and inserted by the first insertion guide post 57a and the second insertion guide post 57b.

Then, the power supply and signal connector 50 is screwed and secured to the case 20 via the first securing section 56a and the second securing section 56b. That is to say, the attachment screw 51 is screwed into the first securing section 27a of the case 20 by inserting the attachment screw 51 through the through opening 56a1 of the first securing section 56a of the power supply and signal connector 50, and another attachment screw 51 is screwed into the second securing section 27b of the case 20 by inserting another attachment screw 51 through the through opening 56b1 of the second securing section 56b of the power supply and signal connector 50. Thus, the power supply and signal connector 50 is screwed and secured to the case 20.

Next, the power supply terminal 55a of the power supply and signal connector 50 inserted into the first through hole 42a of the control board 40 is soldered for connection with the first through hole 42a, and in a similar manner, the automobile communication signal terminal 55b inserted into the second through hole 42b is soldered for connection with the second through hole 42b, the torque signal terminal 55c inserted into the third through hole 42c is soldered for connection with the third through hole 42c, and the resolver signal terminal 55d inserted into the fourth through hole 42d is soldered for connection with the fourth through hole 42d.

Subsequently, the three-phase connector 60 is attached to the three-phase output connector mount section 23. In this situation, the attachment screws 61 are inserted into the through openings 60a of the three-phase output connector 60 and are screwed into the screw openings 23a of the three-phase output connector mount section 23, respectively. Then, the a-phase output terminal 92a, the b-phase output terminal 92b, and the c-phase output terminal 92c on the power module board 30 are soldered for connection with the respective terminals of the three-phase connector 60.

In the end, the cover 70 is attached to the case 20, to which the power module board 30, the control board 40, the power supply and signal connector 50, and the three-phase output connector 60 are attached, from above the control board 40 to cover the control board 40. Thus, the electronic control unit 10 is completed.

Figure 10:
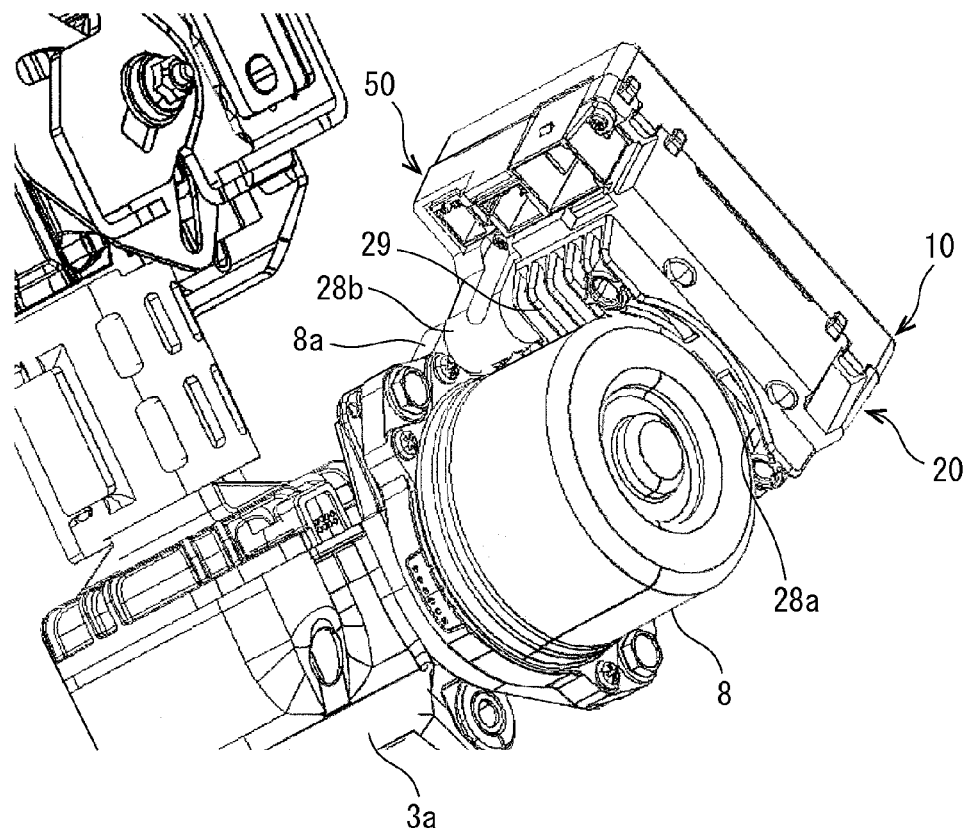
FIG. 10 is a perspective view of a state where the electronic control unit is secured to the electric motor illustrated in FIG. 1.

Then, such a completed electronic control unit 10 is secured to a flange section 8a of the electric motor 8 attached to the housing 3a of the reduction gear 3, as illustrated in FIG. 10. In securing the electronic control unit 10, the electric motor 8 is arranged at the electric motor arrangement space 28a formed in the back face of the case 20, so that the motor securing section 28b is secured onto the flange section 8a of the electric motor 8 by screwing an attachment screw, not illustrated.

In this manner, according to the electronic control unit 10 in some embodiments of the present disclosure, after the power module board 30 and the control board 40 are attached to the case 20, the power supply and signal connector 50 is inserted into the connector receiving depression section 22a formed in the case 20. For this reason, when the power supply and signal connector 50 is inserted into the connector receiving depression section 22a, the terminals 55a to 55d provided in the power supply and signal connector 50 and the control board 40 are not connected. Even if an external force is exerted to the power supply and signal connector 50, no stress will work on parts to be connected.

In addition, the power supply and signal connector 50 is inserted and secured to the connector receiving depression section 22a of the case 20, and the terminals 55a to 55d of the power supply and signal connector 50 and the control board 40 are connected. Then, when the heat load is applied, since the control board 40 to which the terminals 55a to 55d are connected has a different thermal expansion coefficient from that of the case 20, displacement occurs at joint parts of the terminals 55a to 55d and the control board 40, by the heat loaded to the electronic control unit 10. Besides, the power supply and signal connector 50 is inserted and secured onto the connector receiving depression section 22a of the case 20, and the terminals 55a to 55d of the power supply and signal connector 50 are connected to the control board 40. Then, when an external force is exerted to the power supply and signal connector 50, displacement occurs at the joint parts of the terminals 55a to 55d and the control board 40. However, as the power supply and signal connector 50 is screwed and secured onto the case 20 with the first securing section 56a and the second securing section 56b, such displacement can be absorbed. Accordingly, even when the heat is loaded or external force is exerted to the power supply and signal connector 50, the stress to be applied to the joint parts of the terminals 55a to 55d and the control board 40 can be lowered as much as possible. Hence, it is possible to avoid a possibility that short circuit or disconnection occurs due to a crack generated at the joint parts of the terminals 55a to 55d and the control board 40.

In addition, since two places of the first securing section 56a and the second securing section 56b are used for screwing and securing the power supply and signal connector 50 to the case 20, the power supply and signal connector 50 is relatively hardly affected by the deformation of the case 20.

Further, the power supply and signal connector 50 is provided with the positioning section 58 for positioning the power supply and signal connector 50 with respect to the case 20 when the power supply and signal connector 50 is inserted into the connector receiving depression section 22a. Thus, the power supply and signal connector 50 can be positioned with respect to the case.

Further, the first securing section 56a is arranged at the outer circumference of the connector housing 53 and in the vicinity of the torque signal connector receiving depression section 54c and the resolver signal connector receiving depression section 54d, and the second securing section 56b and the positioning section 58 are arranged at the outer circumference of the connector housing 53 and in the vicinity of the power supply connector receiving depression section 54a. The power supply terminal 55a secured onto the power supply connector receiving depression section 54a has large cross sections and large outer shapes are used, as a large current flows. For this reason, the stress by attachment or vibration is easily affected. Hence, the second securing section 56b and the positioning section 58 are provided in the vicinity of the power supply connector receiving depression section 54a, so that they are secured onto the case 20 with the second securing section 56b, and in addition, the positioning function of the positioning section 58 is added, and the securing of the power supply connector receiving depression section 54a side of the connector housing 53 is enhanced. On the other hand, since a small current flows through the terminals 55b to 55d respectively secured onto the automobile communication signal connector receiving depression section 54b, the torque signal connector receiving depression section 54c, and the resolver signal connector receiving depression section 54d, the stress by attachment or vibration is hardly affected. For this reason, the first securing section 56a is arranged in the vicinity of the torque signal connector receiving depression section 54c and the resolver signal connector receiving depression section 54d of the connector housing 53, securing onto the case 20 is merely achieved by the first securing section 56a, and the signal connector receiving depression sections 54b to 54d sides of the connector housing 53 are made relatively deformable.

Further, the power supply and signal connector 50 is configured to be inserted and secured onto the connector receiving depression section 22a of the case 20, and the case 20 and the power supply and signal connector 50 are formed separately. Therefore, with a configuration in which the case 20 is attached to the electric motor 8 to improve the strength of the case 20, a sufficient coupling strength is obtainable when arranged in proximity to the electric motor 8. In some embodiments of the present disclosure, the strength of the case 20 is improved as an aluminum die-casting product.

Furthermore, the first securing section 56a and the second securing section 56b provided in the connector housing 53 are reinforced by the ribs 56a2 and 56b2, respectively. Thus, the strengths are made sufficient. Moreover, since the rib 56a2 reinforcing the first securing section 56a is smaller than the rib 56b2 reinforcing the second securing section 56b, the signal connector receiving depression sections 54b to 54d trough which a small current flows are easily deformable.

Additionally, the flange 53c configured to sit on the flat section 26b arranged on the surrounding wall forming the connector receiving depression section 22a of the case 20 is provided at the outer circumference of the connector housing 53. Thus, the flange 53c sits on the flat section 26b, when the power supply and signal connector 50 is inserted and secured onto the connector receiving depression section 22a of the case 20, so that the dust-proof performance of between the surrounding walls configuring the connector receiving depression section 22a of the case 20 and the flange 53c of the power supply and signal connector 50 can be improved.

Heretofore, embodiments of the present disclosure have been described. Various changes and improvements are applicable to the present disclosure without limiting to this.

For example, the connector housing 53 of the power supply and signal connector 50 includes the automobile communication signal connector receiving depression section 54b, the torque signal connector receiving depression section 54c, and the resolver signal connector receiving depression section 54d. However, at least one signal connector receiving depression section may be provided. In this case, the first securing section 56a is arranged in the vicinity of at least one signal connector receiving depression section separated from the power supply connector receiving depression section 54a.

Further, the depression section 58a is arranged in the positioning section 58 of the power supply and signal connector 50, so that the positioning protrusion section 26a of the case 20 is to be engaged in the depression section 58a. However, the positioning section 58 of the power supply and signal connector 50 may be made to have a protrusion shape, whereas the positioning of the case 20 may be made to have a depression shape.

Furthermore, the signal connector 50 and the three-phase circuit connector 60 may be secured onto the case 20 earlier.

Moreover, the electronic control unit in the electric power steering apparatus has been described as an example of the motor controller in the embodiments of the present disclosure, but may be applicable to devices controlling other types of motors.

REFERENCE SIGNS LIST 1 steering wheel 1
2 column shaft
3 reduction gear 3
3a housing
4A, 4B universal joint
5 rack and pinion mechanism
6 tie rod
7 torque sensor
8 electric motor
9 vehicle sensor
10 electronic control unit
11 control operation unit
12 gate drive circuit
13 motor drive unit
14 cutoff device for emergency stop
15 current detection circuit
16 rotation sensor
17 rotor position detection circuit
18 ignition voltage monitor section
19 power supply circuit section
20 case
21 power module board mount section
21a screw opening
22 power supply and signal connector mount section
22a connector receiving depression section
22b front end wall
22c rear end wall
22d left end wall
22e right end wall
23 three-phase output connector mount section
23a screw opening
24 attachment post
24a screw opening
25a first through opening
25b second through opening
25c third through opening 25d fourth through opening
26a positioning protrusion section
26b flat section
27a first securing section
27b second securing section
28a electric motor arrangement space
28b motor securing section
28c reinforcement rib
29 heat radiation fin
30 power module board
31 board
35 bare chip FET (bare chip transistor)
37 surface mount part
38 attachment screw
39 heat radiation sheet
40 control board
40a through opening
41 attachment screw
42a first through hole
42b second through hole
42c third through hole
42d fourth through hole
43a first through opening
43b second through opening
50 power supply and signal connector
51 attachment screw
53 connector housing
53a first housing body
53b second housing body
54a power supply connector receiving depression section
54b automobile communication signal connector receiving depression section
54c torque signal connector receiving depression section
54d resolver signal connector receiving depression section
55a power supply terminal
55a1 connection section
55a2 contact section
55b automobile communication signal terminal
55b1 connection section
55b2 contact section
55c torque signal terminal
55c1 connection section
55c2 contact section
55d resolver signal terminal
55d1 connection section
55d2 contact section
56a first securing section
56a1 through opening
56a2 rib
56b second securing section
56b1 through opening
56b2 rib
57a first insertion guide post
57b second insertion guide post
58 positioning section
58a depression section
58b projection
60 three-phase output connector
60a through opening
61 attachment screw
70 cover
81 power line
81a positive terminal
82 ground line
82a negative terminal
90 three-phase output section
91a a-phase output line
91b b-phase output line
91c c-phase output line
G gate electrode (electrode)
S source electrode (electrode)

The invention claimed is:

1. A motor controller, comprising:
a case to which a power module board and a control board are attached, the power module board mounting a power device for making a drive current flow to an electric motor, the control board mounting an electronic part for controlling driving of the electric motor;
a connector configured to be inserted into a connector receiving depression section provided in the case;
a connector housing having a power supply connector receiving depression section and at least one signal connector receiving depression section, with the connector being inserted into the connector receiving depression section;
a plurality of terminals configured to be secured to the connector housing and soldered for connection with the control board;
a first securing section and a second securing section configured to secure the connector to the case at an outer circumference of the connector housing; and
a positioning section configured to position the connector to the case, when the connector is inserted into the connector receiving depression section,
wherein the first securing section is arranged at the outer circumference of the connector housing and in vicinity of the at least one signal connector receiving depression section,
wherein the second securing section and the positioning section are arranged at the outer circumference of the connector housing and in vicinity of the power supply connector receiving depression section, and
wherein the first securing section and the second securing section are configured to be reinforced by ribs, respectively, and are arranged at the outer circumference of the connector housing, and
wherein a first rib configured to reinforce the first securing section is smaller than a second rib configured to reinforce the second securing section.

2. The motor controller according to claim 1, wherein a flange configured to sit on a flat section provided at a surrounding wall that configures the connector receiving depression section of the case is provided at the outer circumference of the connector housing.

3. The motor controller according to claim 1, wherein the case is formed to have a substantially rectangular shape, and has an electric motor arrangement space, in which the electric motor is arranged, in one face of the case.

4. The motor controller according to claim 3, wherein the connector receiving depression section is configured such that the one face side of the case opens at one end part in a length direction of the case in vicinity of the electric motor arrangement space in the one face of the case.

5. The motor controller according to claim 4,
wherein the connector housing is formed to have a substantially rectangular shape,
wherein the connector receiving depression section is formed to have a substantially rectangular shape, and
wherein when the connector is inserted and secured, the length direction of the connector is configured to be parallel to a motor axis of the electric motor to be arranged in the electric motor arrangement space.

6. The motor controller according to claim 3, further comprising a pair of motor securing sections configured to secure the case onto the electric motor to be arranged in the electric motor arrangement space is provided in one face of the case and on both sides of the electric motor arrangement space.

7. The motor controller according to claim 6, wherein the pair of motor securing sections is coupled by a reinforcement rib extending from one face of the case.

8. The motor controller according to claim 1, wherein a heat radiation fin is provided in one face of the case.

9. A production method of the motor controller according to claim 1, the production method comprising:
- attaching the power module board and the control board to the case; and
- inserting the connector into the connector receiving depression section arranged in the case,
- wherein the inserting comprises:
- inserting the connector into the connector receiving depression section arranged in the case, while positioning the positioning section arranged at the connector to the case when the connector is inserted into the connector receiving depression section;
- screwing and securing the connector onto the case via the first securing section and the second securing section; and
- connecting each of the plurality of terminals provided in the connector to the control board.

* * * * *